(12) United States Patent
Feroli et al.

(10) Patent No.: US 10,705,121 B2
(45) Date of Patent: Jul. 7, 2020

(54) PROBE CARD CONTINUITY TESTING AND CLEANING FIXTURE COMPRISING HIGHLY PURIFIED TUNGSTEN

(71) Applicant: GLOBALFOUNDRIES INC., Grand Cayman (KY)

(72) Inventors: Ronald A. Feroli, Walden, NY (US); John Cassels, Marlboro, NY (US); Matthew F. Stanton, Salt Point, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 279 days.

(21) Appl. No.: 15/890,270

(22) Filed: Feb. 6, 2018

(65) Prior Publication Data

US 2019/0242927 A1    Aug. 8, 2019

(51) Int. Cl.
*G01R 1/073* (2006.01)
*G01R 31/26* (2020.01)
*G01R 35/00* (2006.01)
*G01R 3/00* (2006.01)

(52) U.S. Cl.
CPC ......... *G01R 1/07342* (2013.01); *G01R 31/26* (2013.01); *G01R 3/00* (2013.01); *G01R 35/00* (2013.01)

(58) Field of Classification Search
CPC ... G01R 1/00; G01R 1/02; G01R 1/06; G01R 1/067; G01R 1/073; G01R 1/07307; G01R 1/07342; G01R 3/00; G01R 31/00; G01R 31/26; G01R 35/00

USPC ......... 324/500, 537, 754.01, 754.03, 754.07, 324/756.01, 756.03
See application file for complete search history.

(56) References Cited

U.S. PATENT DOCUMENTS

| 5,087,878 | A | * | 2/1992 | Belmore, III | G01R 1/07335 324/72.5 |
| 5,150,041 | A | * | 9/1992 | Eastin | G01R 1/04 324/750.23 |
| 5,247,246 | A | * | 9/1993 | Van Loan | G01R 31/316 324/754.14 |
| 5,450,017 | A | * | 9/1995 | Swart | G01R 1/07378 324/754.08 |
| 10,295,566 | B2 | * | 5/2019 | Cadena | G01R 1/0735 |
| 2003/0034782 | A1 | * | 2/2003 | Hirano | G01R 1/07307 324/500 |
| 2010/0194415 | A1 | * | 8/2010 | Wajata | C22C 32/0047 324/755.01 |

(Continued)

*Primary Examiner* — Hoai-An D. Nguyen
(74) *Attorney, Agent, or Firm* — Williams Morgan, P.C.

(57) ABSTRACT

A continuity testing and cleaning fixture includes a continuity test area disposed on a portion of a first surface of the fixture, wherein the continuity test area comprises an upper region comprising at least 99.99 wt % tungsten. The continuity testing and cleaning fixture may be used in a method involving contacting at least two conductive elements of a probe card with a continuity test area of a continuity testing and cleaning fixture, wherein the continuity test area comprises an upper region comprising at least 99.99 wt % tungsten; determining an electrical resistance between the at least two conductive elements; and cleaning the at least two conductive elements with at least one cleaning zone of the continuity testing and cleaning fixture in response to determining the electrical resistance to be above a first threshold.

13 Claims, 3 Drawing Sheets

(56) References Cited

U.S. PATENT DOCUMENTS

| | | | | |
|---|---|---|---|---|
| 2011/0043239 A1* | 2/2011 | Tomita | ............... | G01R 1/0735 |
| | | | | 324/756.03 |
| 2011/0132396 A1* | 6/2011 | Humphrey | ............... | B08B 1/00 |
| | | | | 134/6 |
| 2012/0268153 A1* | 10/2012 | Nickel | ............... | G01R 31/3025 |
| | | | | 324/754.31 |
| 2013/0328582 A1* | 12/2013 | Han | ............... | H01Q 9/0442 |
| | | | | 324/750.02 |

* cited by examiner

PROBE CARD CONTINUITY TESTING AND CLEANING FIXTURE COMPRISING HIGHLY PURIFIED TUNGSTEN

BACKGROUND OF THE INVENTION

Field of the Invention

Generally, the present disclosure relates to semiconductor manufacturing. Specifically, it relates to continuity testing and cleaning fixture comprising highly purified tungsten for semiconductor processing.

Description of the Related Art

Semiconductor manufacturing involves numerous sophisticated systems for designing, fabricating, forming, and testing integrated circuit (IC) devices. As part of testing, an IC device may be contacted with a probe card to test electrical connectivity within the IC device and/or input and output pins of the IC device.

During use, the conductive elements of a probe card may be exposed to various materials, such as processing residues on an IC device or the like. Such materials may foul the conductive elements of the probe card, raising the resistance thereof and reducing the accuracy and/or precision of electrical connectivity measurements of the IC device made by the probe card. Accordingly, it is known to test the probe card with a continuity testing area and clean the probe card with at least one cleaning zone if the test shows high resistance (and presumably, high fouling). Typically, the continuity testing area and the cleaning zone(s) are part of a continuity testing and cleaning fixture, such as a wide area polished plate (WAPP).

However, known continuity testing areas may have one or more properties that reduce the accuracy and/or precision of resistance measurements of the probe card. For example, known continuity testing areas may comprise tungsten of an unknown purity that is believed to be relatively low.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to a continuity testing and cleaning fixture, comprising a continuity test area disposed on a portion of a first surface of the fixture, wherein the continuity test area comprises an upper region comprising at least 99.99 wt % tungsten. The continuity testing and cleaning fixture may be a component of an automatic wafer prober.

The present disclosure is also directed to a method comprising contacting at least two conductive elements of a probe card with a continuity test area of a continuity testing and cleaning fixture, wherein the continuity test area comprises an upper region comprising at least 99.99 wt % tungsten; determining an electrical resistance between the at least two conductive elements; and cleaning the at least two conductive elements with at least one cleaning zone of the continuity testing and cleaning fixture in response to determining the electrical resistance to be above a first threshold.

The present disclosure is also directed to semiconductor device processing systems configured to perform the method.

A continuity test area as described above may allow improved accuracy and/or precision in resistance measurements of probe cards, and accordingly, improved efficiency in semiconductor device manufacturing processes.

BRIEF DESCRIPTION OF THE DRAWINGS

The disclosure may be understood by reference to the following description taken in conjunction with the accompanying drawings, in which like reference numerals identify like elements, and in which.

Figure 1:
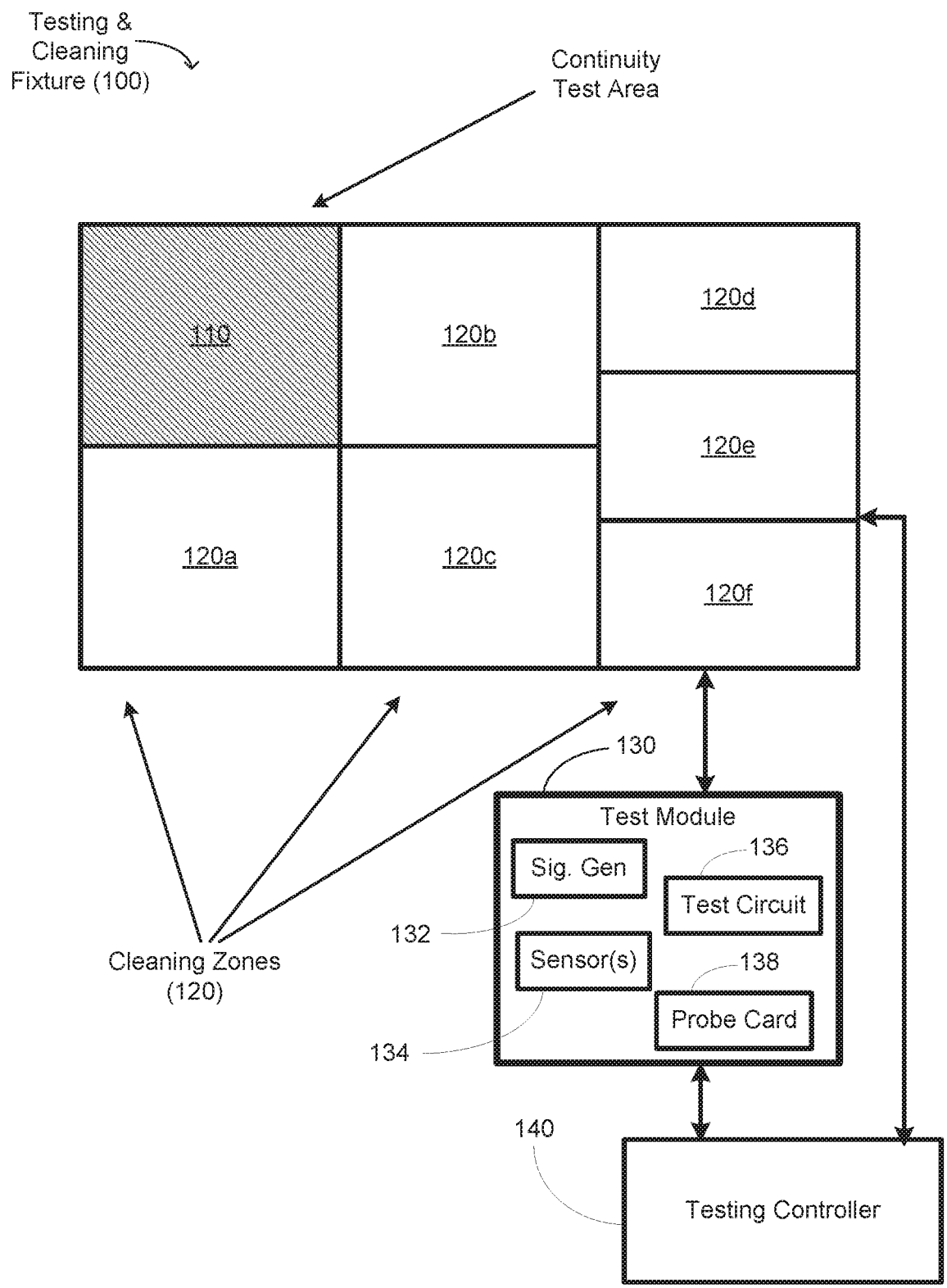
FIG. 1 illustrates a plan or top-down view of a continuity testing and cleaning fixture, in accordance with embodiments herein.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims. Moreover, the stylized depictions illustrated in the drawings are not drawn to any absolute scale.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems, and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Embodiments herein provide for a continuity testing and cleaning fixture. The fixture may be used to test and/or clean a probe card as part of a semiconductor device processing system.

Turning now to FIG. 1, a plan or top-down view of a continuity testing and cleaning fixture 100, in accordance with embodiments herein, is illustrated. The particular continuity testing and cleaning fixture 100 depicted in FIG. 1 may be referred to as a wide area polished plate (WAPP). The continuity testing and cleaning fixture 100 may have any overall dimensions suitable for use with probe cards and/or other semiconductor device processing system components known to the skilled artisan. For example, the continuity testing and cleaning fixture 100 may have surface dimensions of about 100 mm ×about 125 mm, and may have a thickness of about 1 mm.

The continuity testing and cleaning fixture 100 comprises a plurality of areas or zones. The continuity testing and cleaning fixture 100 comprises at least one continuity test area 110. The continuity test area 110 comprises an upper region (i.e., a surface region) comprising highly purified tungsten. This is in contrast to known continuity test areas of known continuity testing and cleaning fixtures available on the market as of this writing, which uses relatively impure tungsten. In one embodiment, the continuity test area 110 may comprise at least 99.99 wt % tungsten. The purity of tungsten in the continuity test area 110 may be even higher, e.g., in one embodiment, the continuity test area may comprise at least 99.995 wt % tungsten. Highly purified tungsten may impart to the continuity test area 110 improved effectiveness for use in a method described below.

The continuity test area 110 may have any thickness up to the full thickness of the continuity testing and cleaning fixture 100. In some embodiments, in order to reduce the amount of highly purified tungsten required for the continuity testing and cleaning fixture 100, and to provide a sufficient thickness of highly purified tungsten for use in the method described below, the upper region of the continuity test area 110 may have a thickness from about 250 Å to about 25,000 Å. In a particular embodiment, the upper region of the continuity test area 110 may have a thickness of about 2500 Å.

The continuity test area 110 may comprise a lower region comprising silicon. In some embodiments, the thickness of the polished plate, provided by the combined thicknesses of the upper region and the thickness of the lower region, may be about 0.77 mm.

The continuity test area 110 may have any surface area suitable for use with probe cards and/or other semiconductor device processing system components known to the skilled artisan. In one embodiment, the continuity test area 110 may have a surface area from about 1000 mm$^2$ to about 4000 mm$^2$. For example, the continuity test area 110 may have a surface area of 50 mm×41.9 mm, or 2095 mm$^2$.

In addition to the continuity test area 110, the continuity testing and cleaning fixture 100 may further comprise one or more cleaning zones 120. In one embodiment, the continuity testing and cleaning fixture 100 may comprise at least three cleaning zones 120a, 120b, and 120c (collectively forming the cleaning zones 120). In a further embodiment, the continuity testing and cleaning fixture 100 may comprise at least six cleaning zones 120a, 120b, 120c, 120d, 120e, and 120f that collectively form the cleaning zones 120.

A test module 130 may be configured to communicate with the testing and cleaning fixture 100. The test module 130 may include a signal generator 132 for generating one or more electrical signals (e.g., DC test signal) for performing tests on a semiconductor device being fabricated. One or more sensors 134 may detect results from tests performed on the semiconductor device being fabricated. The test module 130 also comprises a probe card 138. The probe card 138 may be used to test electrical connections within the semiconductor device being fabricated. The probe card 138 may be tested and cleaned by the continuity testing and cleaning fixture 100. The operations, e.g., generating and sending test signals, receiving resultant signals, etc.) may be controlled by the test circuit 136, which may include analog and/or digital circuitry. One or more operations performed by the continuity testing and cleaning fixture 100 and the test module 130 may be controlled by a testing controller 140. The testing controller 140 is capable of controlling the testing functions performed by the testing module 130. The testing controller 140 may record and/or report test results.

The testing controller 140 may include a processor, circuitry, memory, etc. that may be programmed to control the operations of the fixture 100. In some embodiments, the testing controller 140 may include field programmable gate arrays (FPGA) or other programmable elements. As such, the testing controller 140 may include hardware, software, and/or firmware modules, or modules that are a combination thereof.

Figure 2:
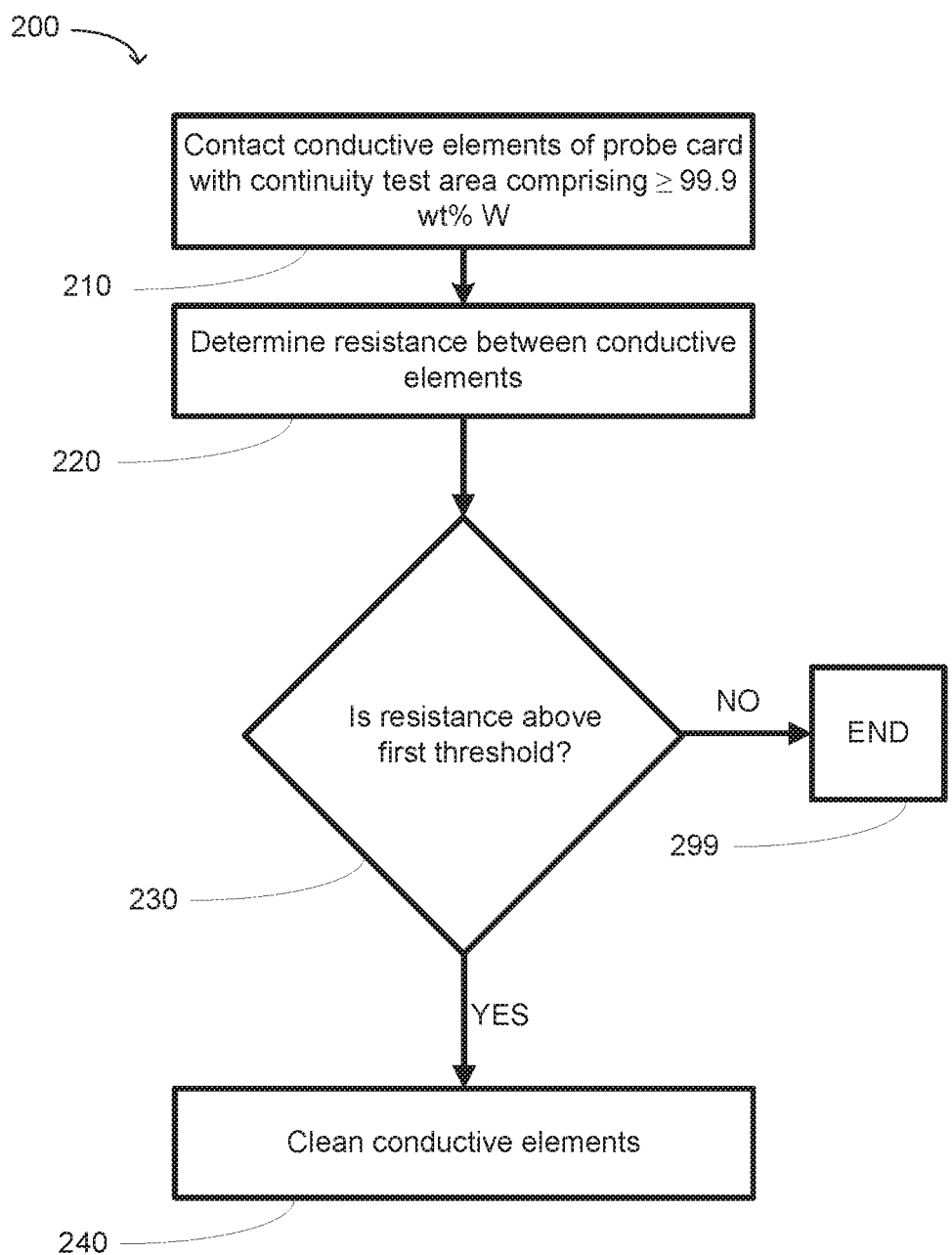
FIG. 2 illustrates a flowchart of a method, in accordance with embodiments herein.

Turning now to FIG. 2, a flowchart of a method 200 is presented. The method 200 comprises contacting (at 210) at least two conductive elements of a probe card with a continuity test area of a continuity testing and cleaning fixture, wherein the continuity test area comprises an upper region comprising highly purified tungsten, e.g., at least 99.99 wt % tungsten. For example, the contacting (at 210) may be with the continuity test area 110 of the continuity testing and cleaning fixture 100 depicted in FIG. 1. The probe card may be a probe card 138 described above.

The conductive elements of a probe card may be commonly referred to as pins. The contacting (at 210) provides electrical communication (e.g., a short) between the at least two conductive elements/pins through the continuity test area of the continuity testing and cleaning fixture. This electrical communication may be detected by a testing module 130 and/or may be reported and/or recorded by the testing controller 140.

The method 200 further comprises determining (at 220) an electrical resistance between the at least two conductive elements. The resistance between conductive elements can be routinely determined by the person of ordinary skill in the art. In some embodiments, the resistance may be determined by detecting the voltage across two conductive elements and dividing by a measured current. In one embodiment, the resistance may be less than or equal to 1Ω.

Subsequently, flow of the method 200 passes to determining (at 230) whether the electrical resistance is above a first threshold. Though not to be bound by theory, the present inventors have observed a general correlation between higher resistance and increased fouling of the conductive elements.

If the resistance as determined (at 230) is above the first threshold, the method 200 continues to cleaning (at 240) the conductive elements with at least one cleaning zone of the continuity testing and cleaning fixture. The structure of the cleaning zones of the continuity testing and cleaning fixture, and particular cleaning techniques that may be used, are routine matters to the person of ordinary skill in the art.

If the resistance as determined (at 230) is below the first threshold, the conductive elements may be considered sufficiently free of fouling that cleaning (at 240) is not required. Accordingly, the flow of the method 200 passes to an end condition (at 299).

The method 200 may be performed on a probe card on a fixed schedule or in response to an observed indication that the probe card's conductive elements may have sufficient fouling that cleaning may be required. For example, if the probe card is exposed to reactive materials and/or reaction conditions that increase the risk of fouling, the probe card may be subjected to the method 200 more frequently than if the probe card is exposed to materials and/or conditions with no increased risk of fouling.

Figure 3:
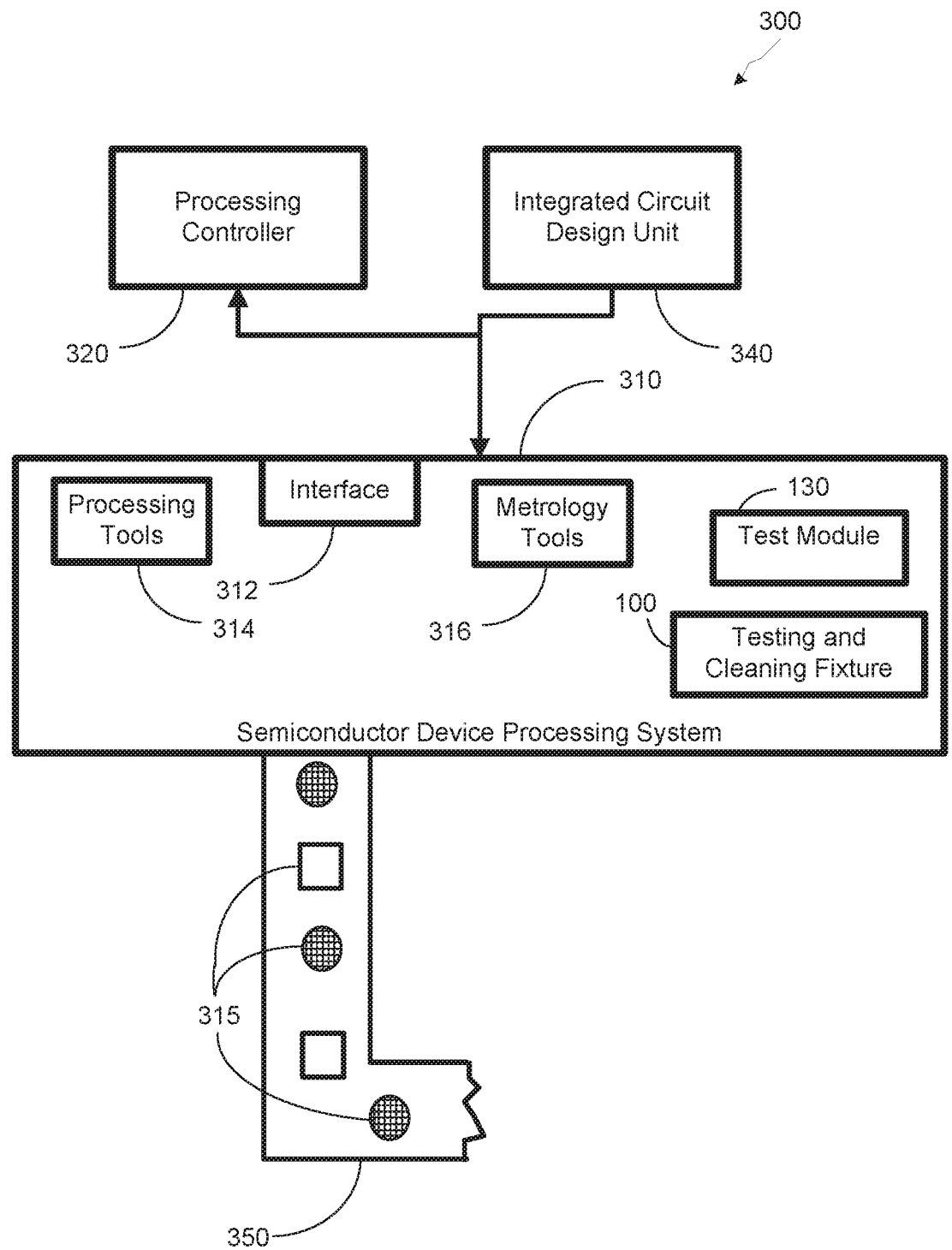
FIG. 3 illustrates a stylized depiction of a system for fabricating a semiconductor device, in accordance with embodiments herein.

Turning now to FIG. 3, a stylized depiction of a system 300 for fabricating a semiconductor device, in accordance with embodiments herein, is illustrated. A system 300 of FIG. 3 may comprise a semiconductor device processing system 310 and an integrated circuit design unit 340. The semiconductor device processing system 310 may manufacture integrated circuit devices based upon one or more designs provided by the integrated circuit design unit 340.

The semiconductor device processing system 310 may comprise various processing stations, such as etch process stations, photolithography process stations, CMP process stations, etc. Each of the processing stations may comprise one or more processing tools 314 and or metrology tools 316. Feedback based on data from the metrology tools 316 may be used to modify one or more process parameters used by the processing tools 314 for performing process steps.

The semiconductor device processing system 310 may also comprise an interface 312 that is capable of providing communications between the processing tools 314, the metrology tools 316, and a controller, such as the processing controller 320. One or more of the processing steps performed by the semiconductor device processing system 310 may be controlled by the processing controller 320. The processing controller 320 may be a workstation computer, a desktop computer, a laptop computer, a tablet computer, or any other type of computing device having one or more software products that are capable of controlling processes, receiving process feedback, receiving test results data, performing learning cycle adjustments, performing process adjustments, etc.

The semiconductor device processing system 310 may include a test module 130, as described above, which includes a probe card 138 for testing integrated circuits on wafers/die 315. The semiconductor device processing system 310 may also include a continuity testing and cleaning fixture 100, as described above, for testing and cleaning the probe card.

The semiconductor device processing system 310 may produce integrated circuits (e.g., on a medium, such as silicon wafers.

The production of integrated circuits by the semiconductor device processing system 310 may be based upon the circuit designs provided by the integrated circuit design unit 340. The semiconductor device processing system 310 may provide processed integrated circuits/devices 315 on a transport mechanism 350, such as a conveyor system. In some embodiments, the conveyor system may be sophisticated clean room transport systems that are capable of transporting semiconductor wafers. In one embodiment, the semiconductor device processing system 310 may comprise a plurality of processing steps, e.g., the $1^{st}$ process step, the $2^{nd}$ process step, etc., as described above.

In some embodiments, the items labeled "315" may represent individual wafers, and in other embodiments, the items 315 may represent a group of semiconductor wafers, e.g., a "lot" of semiconductor wafers. The integrated circuit or device 315 may comprise a transistor, a capacitor, a resistor, a memory cell, a processor, and/or the like.

The integrated circuit design unit 340 of the system 300 is capable of providing a circuit design that may be manufactured by the semiconductor device processing system 310. The integrated circuit design unit 340 may be capable of determining the number of devices (e.g., processors, memory devices, etc.) to place in a device package. Based upon such details of the devices, the integrated circuit design unit 340 may determine specifications of the devices that are to be manufactured. Based upon these specifications, the integrated circuit design unit 340 may provide data for manufacturing a semiconductor device package described herein.

The system 300 may be capable of performing analysis and manufacturing of various products involving various technologies. For example, the system 300 may receive design and production data for manufacturing devices of CMOS technology, Flash technology, BiCMOS technology, power devices, memory devices (e.g., DRAM devices), NAND memory devices, and/or various other semiconductor technologies. This data may be used by the system 300 to fabricate semiconductor devices described herein.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A system, comprising:
   a semiconductor device processing system to manufacture a semiconductor device, wherein the semiconductor device processing system comprises a probe card and a continuity testing and cleaning fixture comprising at least one cleaning zone and a continuity test area comprising an upper region comprising at least 99.99 wt % tungsten; and
   a processing controller operatively coupled to said semiconductor device processing system, said processing controller configured to control an operation of the semiconductor device processing system;
   wherein the semiconductor device processing system is adapted to:
   probe the semiconductor device with the probe card; and
   contact at least two conductive elements of the probe card with the continuity test area;
   determine an electrical resistance between the at least two conductive elements; and
   clean the at least two conductive elements with the at least one cleaning zone of the continuity testing and cleaning fixture in response to determining the electrical resistance to be above a first threshold.

2. The system of claim 1, wherein the upper region of the continuity test area comprises at least 99.995 wt % tungsten.

3. The system of claim 1, wherein the upper region of the continuity test area has a thickness from about 250 Å to about 25,000 Å.

4. The system of claim 3, wherein the upper region of the continuity test area has a thickness of about 2500 Å.

5. The system of claim 1, wherein the continuity testing and cleaning fixture further comprises at least three cleaning zones.

6. The system of claim 5, wherein the continuity testing and cleaning fixture comprises at least six cleaning zones.

7. A method, comprising:
   contacting at least two conductive elements of a probe card with a continuity test area of a continuity testing and cleaning fixture, wherein the continuity test area comprises an upper region comprising highly purified tungsten;
   determining an electrical resistance between the at least two conductive elements; and
   cleaning the at least two conductive elements with at least one cleaning zone of the continuity testing and cleaning fixture in response to determining the electrical resistance to be above a first threshold.

8. The method of claim 7, wherein the continuity test area has a surface area from about 1000 $mm^2$ to about 4000 $mm^2$.

9. The method of claim 7, wherein the upper region of the continuity test area comprises at least 99.99 wt % tungsten.

10. The method of claim 7, wherein the upper region of the continuity test area has a thickness from about 250 Å to about 25,000 Å.

11. The method of claim 10, wherein the upper region of the continuity test area has a thickness of about 2500 Å.

12. The method of claim 7, wherein the continuity testing and cleaning fixture further comprises at least three cleaning zones.

13. The method of claim 12, wherein the continuity testing and cleaning fixture comprises at least six cleaning zones.

* * * * *